US006580297B2

United States Patent
Kojima

(10) Patent No.: US 6,580,297 B2
(45) Date of Patent: Jun. 17, 2003

(54) FREQUENCY COMPARISON CIRCUIT

(75) Inventor: Hiroaki Kojima, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/734,451

(22) Filed: May 30, 2001

(65) Prior Publication Data
US 2002/0180488 A1 Dec. 5, 2002

(30) Foreign Application Priority Data
Dec. 8, 1999 (JP) .............................. 11-348233

(51) Int. Cl.$^7$ ................................................ H03K 9/06
(52) U.S. Cl. ......................................... 327/39; 327/40
(58) Field of Search ............................. 327/39, 40, 41, 327/42, 43, 44, 45, 46, 47, 48, 49, 170

(56) References Cited

U.S. PATENT DOCUMENTS 5,317,215 A  *  5/1994  Kranzler ...................... 327/44
5,657,361 A  *  8/1997  Inagaki et al. ................ 327/48
6,081,137 A  *  6/2000  Choi ........................... 327/218

* cited by examiner

Primary Examiner—Timothy P. Callahan
Assistant Examiner—Linh Nguyen
(74) Attorney, Agent, or Firm—William B. Kempler; W. James Brady; Frederick J. Telecky, Jr.

(57) ABSTRACT

The objective of the invention is to provide technology to give high-speed DVD RF signal reading.

Frequency comparison circuit 1 of the present invention has edge spacing detection circuit 3, maximum spacing detection circuit 4, and minimum spacing detection circuit 5. The number of reference clock pulses in response to an RF signal pulse width (edge spacing) is detected by edge spacing detection circuit 3. The maximum value of the edge spacing in one frame, that is, the maximum edge spacing, is detected by maximum spacing detection circuit 4. The minimum value of the maximum edge spacing in multiple frames is detected by minimum spacing detection circuit 5. The maximum edge spacing minimum value is compared with a number that indicates the frame synchronizing signal period to perform frequency comparison. Edge spacing detection circuit 3, maximum spacing detection circuit 4, and minimum spacing detection circuit 5 are each constituted with registers. Frequency comparison is thus possible without using slow-speed comparators or counters, so that the operating speed can be increased compared with circuits of the prior art that use such comparators and counters.

10 Claims, 5 Drawing Sheets

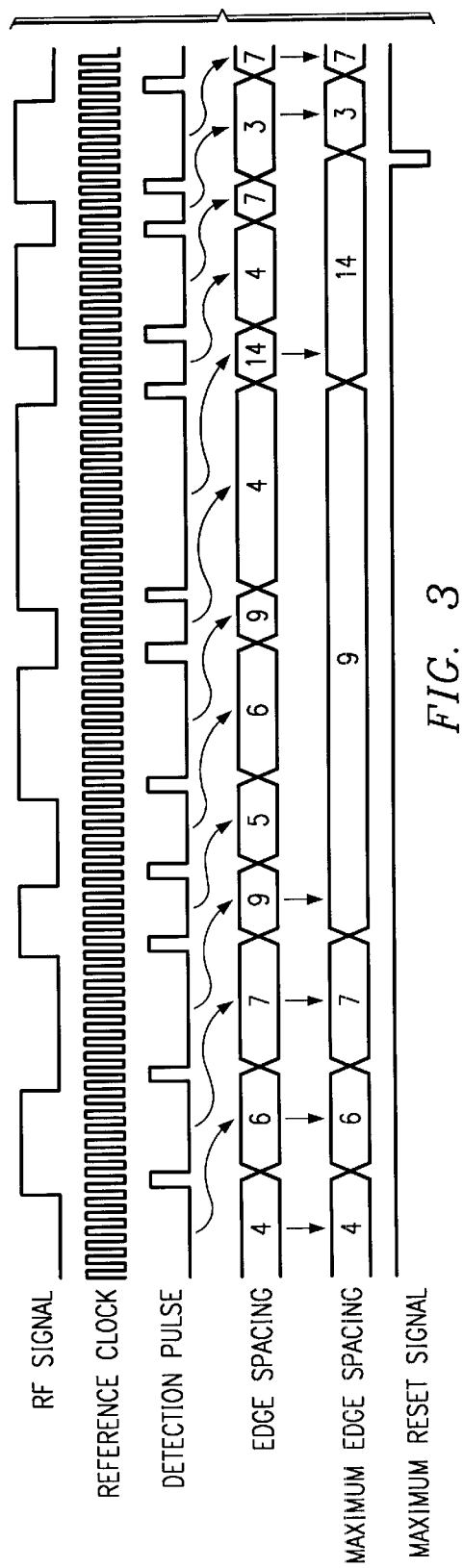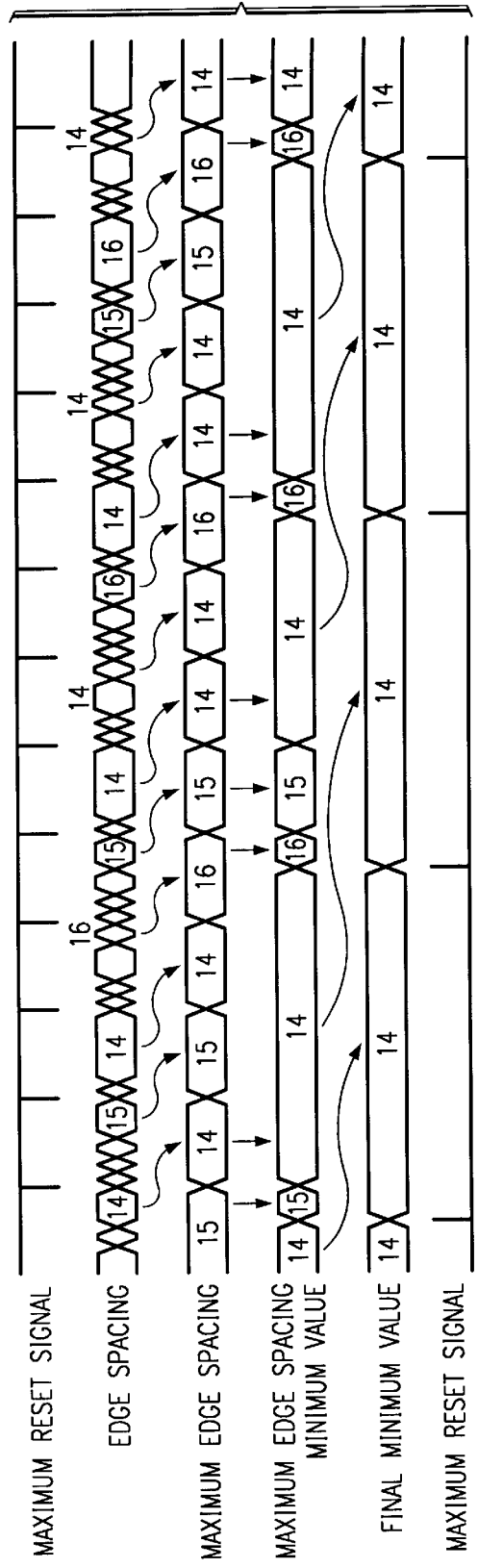

FREQUENCY COMPARISON CIRCUIT

FIELD OF THE INVENTION

The present invention pertains to the technical field of data reproduction devices that reproduce data stored on a recording medium while the disk-shaped recording medium, e.g., an optical disk, such as a CD (compact disc) or a DVD (digital video disc), is rotated at constant speed.

BACKGROUND OF THE INVENTION

Modulated data with a prescribed number of bits in which the original digital data have been EFM modulated are stored on disk-shaped recording media (hereafter called discs), e.g., CDs or DVDs. To demodulate and reproduce these modulated data, a motor is driven, and while the disk is rotated at constant speed, an optical pickup is moved to a read position. In the read position, the optical pickup illuminates the rotating disc, the light reflected by the disc is sensed, and analog RF (radio frequency) signals that indicate the stored contents of the disc are produced.

On discs, e.g., DVDs, data are described with a CLV (constant linear velocity) system, that is, a system that maintains a constant linear speed, and reading devices often read with a CAV (constant angular velocity) system, where the angular velocity is constant, since disc rotation is easily controlled. In such cases, the read frequency of RF signals varies according to the disc read position. The RF signals are read synchronized to reference clocks, so that when the reference clock frequency is fixed, they cannot be synchronized to the RF signals and they cannot be read correctly.

In order to read the RF signals correctly, reference clock frequency must be constantly controlled to agree with the RF signal read frequency.

Letting the time corresponding to 1 bit of data be T, with DVDs, RF signals are data that have a maximum 14T pulse width, and a period of 1488T is considered one frame. One frame contains only one pulse string that has a pulse width of 14T and it is used as the frame synchronizing signal.

To reproduce reference clocks from such RF signals, the reference clock frequency must first be matched to the RF signal read frequency. For this reason, the reference clock frequency is controlled so that a number (here 14) that indicates the frame synchronizing signal period and the same number of reference clocks are output while frame synchronizing signals are output.

PLLs are often used as circuits for matching reference clock frequency and RF signal frequency. PLLs have a frequency comparison circuit, a loop filter with the input terminal connected to the output terminal of the frequency comparison circuit, and VCO (voltage-controlled oscillator) with the input terminal connected to the output terminal of the loop filter. They are constituted so that VCO output signals and RF signals will be input to the frequency comparison circuit. The frequency comparison circuit controls the VCO control voltage with RF signals as reference signals so that VCO output signal frequency and RF signal frequency will agree.

An example of a frequency comparison circuit that is used when reference clocks are produced from the RF signals of a DVD is indicated by reference number (101) in FIG. 7.

This frequency comparison circuit (101) has edge detection circuit (102), counter (103), comparator (104), maximum latch circuit (105), minimum latch circuit (106), and timing generation circuit (107).

RF signals and reference clocks for when RF signals are read are input to edge detection circuit (102), the rising/falling edge of the RF signals is detected synchronized to the reference clock that is currently being output, and detection pulses are output to counter (103).

RF signal rising/falling edge detection pulses and reference clocks are input to counter (103) and the number of reference clock pulses are counted in binary values during the period from when the edge detection pulse is input until the next edge detection pulse is input. The count value is output to comparator (104).

Comparator (104) compares the output value of counter (103) with a number (here 14) that indicates the frame synchronizing signal period and outputs the result to maximum latch circuit (105). When the output value of counter (103) is larger than the reference value "large" is output, when it is smaller, "small" is output, and when it is equal to the reference value, "equal" is output to maximum latch circuit (105).

Maximum latch circuit (105) compares the current value in the latch with the output of comparator (104), and the current value is replaced with a larger value. The priority for rewriting is "large," "agree," and "small." When "small" is held and "equal" is input, it is replaced by "agree," and when "equal" is held and "large" is input, it is replaced by "large." And when "equal" is held and "small" is input, "equal" is held, and when "large" is held and "equal" or "small" is input, "large" is held.

With the aforementioned circuit, each time that an RF signal edge detection pulse is output sequentially by edge detection circuit (102), the number of reference clock pulses is counted by counter (103). This number of pulses corresponds to the RF signal pulse width. With comparator (104), each time that a count value is output from counter (103), the count value and a number that indicates the frame synchronizing signal period are compared and the comparison result is output to maximum latch circuit (105).

The value held in maximum latch circuit (105) is reloaded each time that a comparison result is input. This held value is reset by timing generation circuit (107) at time intervals that include at least one frame. Immediately before it is reset, the value held by maximum latch circuit (105) will be equal to the result of comparing the maximum value of the pulse width actually detected during one frame and a number that indicates the frame synchronizing signal period. The held value obtained in this way is output to minimum latch circuit (106).

Minimum latch circuit (106) compares the current value held in the latch with the output value of maximum latch circuit (105), and the current value is replaced with a smaller value. The priority for rewriting is "small," "agree," and "large." When "large" is held and "equal" is input, "equal" is held, and when "equal" is held and "small" is input, "small" is held. When "equal" is held, if "large" is input, "equal" is held, and when "small" is held, if "equal" or "large"is input, "small" is held.

The value held by minimum latch circuit (106) is reset at time intervals that include multiple frames by timing generation circuit (107). During the period before reset, the results of comparing the maximum value of the pulse width actually detected in one frame and a number that indicates the frame synchronizing signal period are input multiple times from maximum latch circuit (105). Minimum latch circuit (106) holds the comparison result that corresponds to the smallest of those values.

As described above, one of the values "large, "agree," or "small," corresponding to the result of comparing the maximum value of the pulse width detected during one frame and a number that indicates the frame synchronizing signal period, is held by minimum latch circuit (106) and is output to a VCO; not shown, via a loop filter.

The VCO controls the reference clock frequency in response to the output value from minimum latch circuit (106). If the output value from minimum latch circuit (106) is "small," the reference clock frequency is lower than the RF signal read frequency. Thus, the reference clock frequency is raised by a prescribed amount. On the other hand, if the output from minimum latch circuit (106) is "large," the reference clock frequency is higher than the RF signal read frequency. Thus, the reference clock frequency is lowered to 7 a prescribed amount. By controlling the reference clock frequency in this way, the maximum value of the pulse width detected in one frame and a number that indicates the frame synchronizing signal period will agree.

The output value from minimum latch circuit (106) will be "equal" because of this control. If the maximum value for pulse width detected in one frame and a number that indicates the frame synchronizing signal period are equal, the reference clock frequency will be equal to RF signal frequency. In this way, the reference clock frequency and the RF signal read frequency are matched.

After the RF signal read frequency and the reference clock frequency are matched in this way, if the reference clock phase is equal to the RF signal phase, reference clocks that correspond to RF signals can be generated. By reading RF signals synchronized to this reference clock, correct data reproduction will be possible.

However, in frequency comparison circuit (101) with the aforementioned constitution, a comparator (103) with a slow processing speed is used. The count value and the reference value must be compared each time a count value is output from counter (102), so that it has been difficult to further increase operating speed of the comparator (103).

The present invention was conceived to solve the aforementioned difficulties of the prior art. A general object of the present invention is to provide a frequency comparison circuit that will permit frequency comparison to be performed rapidly.

SUMMARY OF THE INVENTION

This and other objects, features and advantages are attained in accordance with one aspect of the invention by a frequency comparison circuit having an edge detection circuit into which serial signals that are binary data and clock signals are input and that outputs pulse signals that indicate changes in the aforementioned serial signal data, an edge spacing detection circuit into which the aforementioned pulse signals and the aforementioned clock signals are input and that outputs numerical data that indicate the aforementioned clock signal frequency corresponding to the period during which there are no changes in the aforementioned serial signal data, and a maximum value memory circuit into which the aforementioned numerical data, the aforementioned clock signals, and a first reset signal are input, that stores the maximum value of the aforementioned numerical data in response to the aforementioned clock signals and that also resets the stored maximum value in response to the aforementioned first reset signal.

Another aspect of the invention comprises a frequency comparison circuit with a value minimum memory circuit into which the aforementioned maximum value, the aforementioned first reset signal, and a second reset signal are input, which stores and outputs the minimum value of the aforementioned maximum value in response to the aforementioned first reset signal and also resets the aforementioned minimum signal in response to the aforementioned second reset signal.

A further aspect of the invention includes a frequency comparison circuit having an edge spacing detection circuit that includes a series transistor. The aforementioned numerical data are formed by sequentially shifting a first value or second value from the initial level of the aforementioned series transistor in response to the aforementioned clock signals when the aforementioned pulse signals are a first value or a second value and the aforementioned series transistor is reset by logic changes in the aforementioned pulse signals.

A fourth aspect of the invention includes a frequency comparison circuit having a maximum spacing detection circuit that includes multiple first unit memory circuits that correspond to the prescribed level of the aforementioned series transistor. And each of the aforementioned unit memory circuits finds the aforementioned maximum value by calculating the logical sum of prescribed bits of the aforementioned numerical data and a stored value.

A fifth aspect of the invention comprises frequency comparison circuit described in claim 4, where the aforementioned minimum value detection circuit includes multiple second unit memory circuits that correspond to the aforementioned multiple first unit memory circuits. And each of the aforementioned second unit memory circuits finds the aforementioned minimum value by calculating the logical sum of prescribed bits of the aforementioned maximum value and a stored value.

A sixth aspect of the invention includes a frequency comparison circuit having an output circuit that finds frequency comparison signals from differences in values of adjacent aforementioned first unit memory circuits and aforementioned second unit memory circuits.

With the frequency comparison circuit of the present invention, the edge spacing detection circuit can detect the number of clock signal pulses by storing a first value continuously from the top of the serial register that is equal to the number of clock signal (reference clock) pulses input.

A maximum value detection circuit is finished for the aforementioned comparison circuit. When the number of multiple clock signal pulses is detected, multiple first unit memory circuits that correspond to prescribed stages of the aforementioned serial registers detect the maximum value of the number of clock pulse signals by calculating the logical sum of prescribed bits of the numerical data output from the aforementioned serial register and a stored value.

With the constitution described above, once a first value is stored in each of the first unit memory circuits of the maximum value detection circuit, even if the prescribed bits of the aforementioned numerical data change to a second value, the first value will continue to be stored. Thus, with each of the first unit memory circuits of the aforementioned maximum value detection circuit, the number of first unit memory circuits in which the first value is stored may increase, rather than decrease.

By letting the number of first unit memory circuits in which the first value is stored correspond to the number of clock signal pulses during the period when there are no logic level changes, the first value will be stored in each of the first unit memory circuits of the maximum value detection circuit in a the number corresponding to the maximum value of clock signal pulses that are detected multiple times.

In a frequency comparison circuit with this constitution, when serial signals are used as RF signals, a first value is stored in the maximum value detection circuit in a the number that corresponds to the frame synchronizing signals that has the maximum pulse width of the RF signals and the number of clock pulse signals can be detected according to the maximum pulse width of the RF signals. Thus, the magnitude of the RF signal read frequency and the clock signal frequency can be compared.

In the past, to compare the RF signal read frequency and the clock signal frequency, a low-speed counter or comparator or the like would have been used, but the frequency comparison circuit of the present invention can be constituted with string of registers, e.g., shift registers (serial registers). It is not necessary to use counters or comparators, and operating speed can be improved compared to the past.

Note that the frequency comparison circuit of the present invention could also be constituted to reset the contents stored in each of the first unit memory circuits in the maximum value detection circuit to a second value with a first reset signal. Particularly when the RF signal read frequency and the clock signal are compared, the number of clock signal pulses can be found by resetting each frame and when the maximum pulse length in one frame, which is the frame synchronizing signal, is output.

Also, an output circuit that outputs frequency comparison signals could also be furnished in the frequency comparison circuit of the present invention. It is possible to detect positions where the stored contents are different according to this output circuit. The positions where stored contents are different correspond to the number of clock signal pulses, so that errors between the clock signal frequency and the RF signal read frequency can be found.

In addition, the frequency comparison circuit of the present invention could also be constituted with a minimum value detection circuit.

By constituting it in this way, once a second value is stored in each of the second unit memory circuits in the minimum value detection circuit, even if the prescribed bits of the aforementioned numerical data then become the first value, the second value will continue to be stored. Thus, with each of the second unit memory storage circuits in the minimum value detection circuit, the number of second unit memory circuits in which the second value is stored may increase, rather than decrease. On the other hand, the number of second unit memory circuits in which the first value is stored may decrease, rather than increase.

The number of first unit memory circuits in which the first value is stored corresponds to the number of clock signal pulses, as stated above. So that the first value will be stored in a number that corresponds to the smallest value of the maximum values of the number of clock signal pulses detected multiple times, in each of the second unit memory circuits in the minimum value detection circuit.

Especially when the serial signals are RF signals, a non-signal state may occur due to an abnormality, a value larger than the maximum value of the original number of clock signal pulses may be detected, and a malfunction may therefore occur. But with the aforementioned minimum value detection circuit, multiple maximum values are sampled and the smallest of these values is used as the maximum value; in this way, a non-signal state will not be detected as a maximum value. Thus, it is possible to be sure that a malfunction will not occur due to the detection of a non-signal state as a maximum value.

Note that the frequency comparison circuit of the present invention could also be constituted so that the stored contents of each of the second unit memory circuits in the minimum value detection circuit could be reset to a second value with a second reset signal.

BRIEF DESCRIPTION OF THE DRAWINGS

FIG. 3: First timing diagram that explains the operation of a frequency comparison circuit of one embodiment of the present invention.

FIG. 4: Second timing diagram that explains the operation of a frequency comparison circuit of one embodiment of the present invention.

REFERENCE NUMERALS AS SHOWN IN THE DRAWINGS

In the figures, 2 represents an edge detection circuit, 3 edge spacing detection circuit, 4 maximum spacing detection circuit, 5 minimum spacing detection circuit, 7 timing generation circuit, 8 frequency difference extraction circuit, $32_1$–$32_{20}$, $42_7$–$42_{20}$, $52_7$–$52_{20}$ . . . flip-flop circuit (unit memory circuit), 71 Maximum spacing reset circuit, 72 Minimum spacing reset circuit.

DESCRIPTION OF THE EMBODIMENTS

Embodiments of the present invention will be explained with reference to the figures below.

Figure 1A:
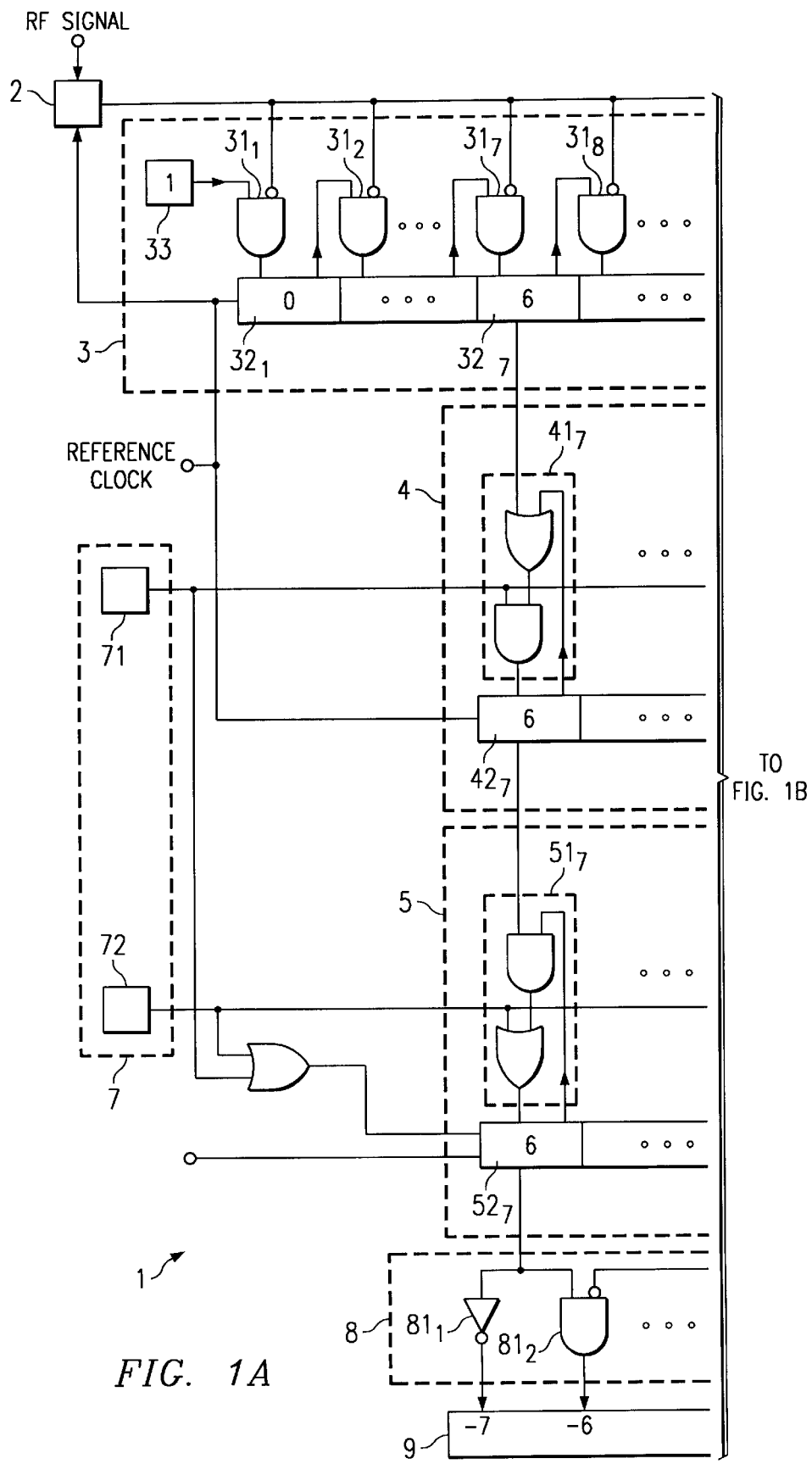
FIGS. 1A and 1B: Circuit diagram that explains a frequency comparison circuit of one embodiment of the present invention.
Figure 1B:
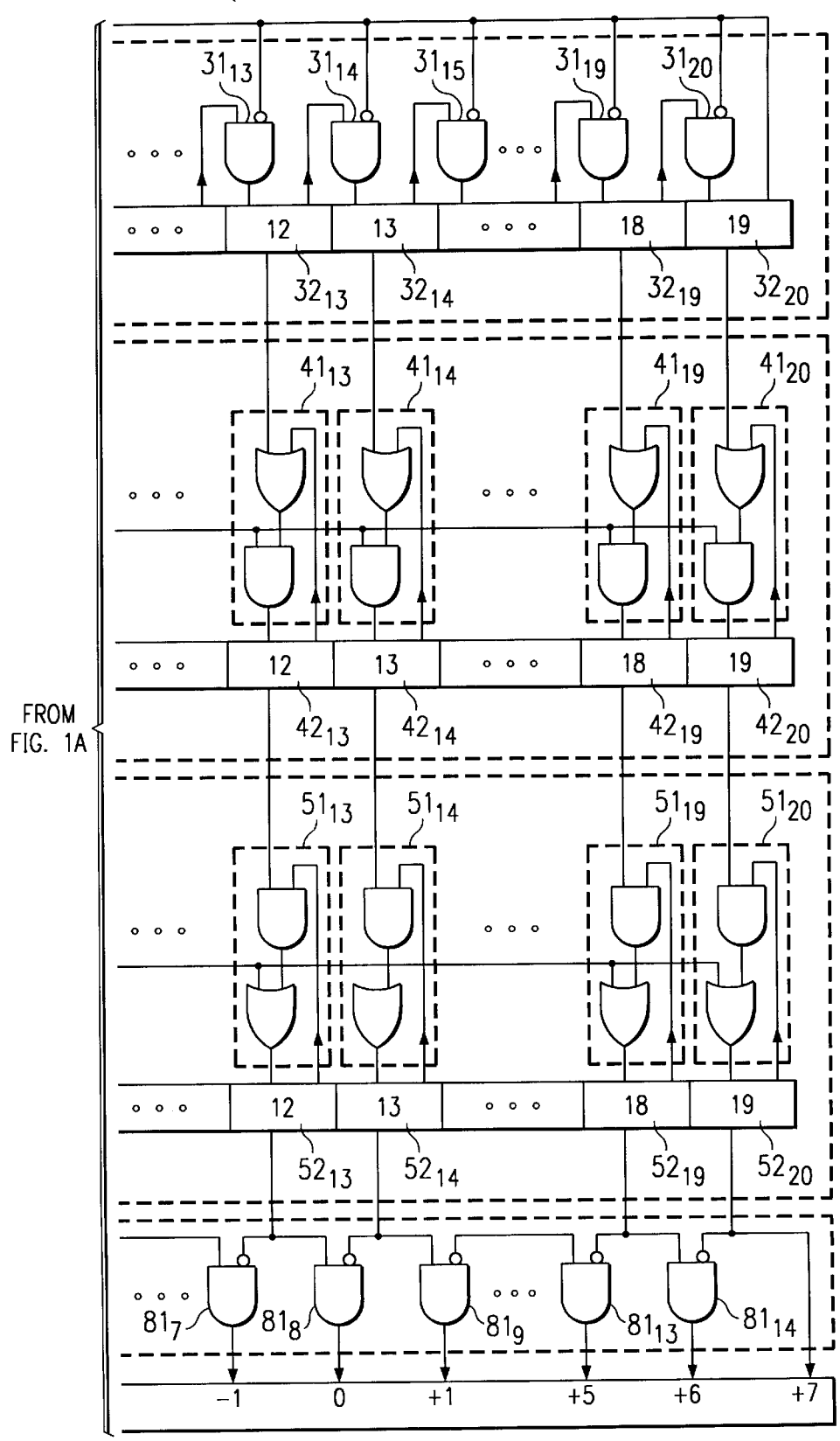

An example of a frequency comparison circuit that is part of a clock generation circuit for RF signals recorded on a DVD and that operates by comparing a reference clock frequency with a RF signal read frequency to match them is indicated by symbol 1 in FIG. 1.

Figure 2:
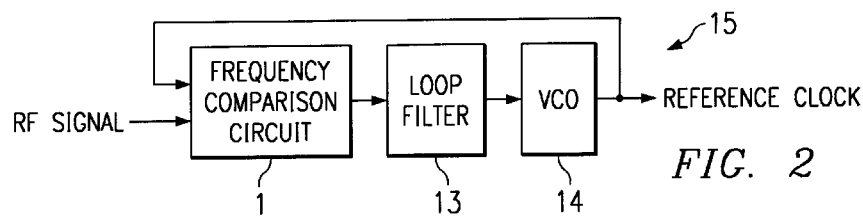
FIG. 2: Circuit diagram that explains the PLL loop of one embodiment of the present invention.

This frequency comparison circuit 1 is constituted with PLL loop 15, along with loop filter 13 and VCO 14 shown in FIG. 2. It has edge detection circuit 2, edge spacing detection circuit 3, maximum spacing detection circuit 4, minimum spacing detection circuit 5, timing generation circuit 7, and frequency difference extraction circuit 8.

Edge detection circuit 2 is constituted so that an RF signal output from an optical pickup and a reference clock output from VCO 14 are input. This RF signal is an example of serial data and is composed of a binary signal with either of two levels: high or low. Edge detection circuit 2 detects the RF signal rising/falling edge synchronized with the reference clock and outputs a detection pulse to edge spacing detection circuit 3. This detection pulse has a pulse width (synchronous width) of 1 cycle of the reference clock and is a pulse that is output synchronized with the reference pulse. It is a pulse that rises to "1" synchronized with the rise of the reference clock when an edge is detected and that falls to "0" synchronized with the fall of the subsequent next reference clock.

Edge spacing detection circuit 3 has one state setting circuit 33 and multiple (here 20) logic circuits $31_1$–$31_{20}$ and flip-flop circuits $32_1$–$32_{20}$.

Each logic circuit $31_1$–$31_{20}$ has an inverter circuit and an AND-gate. The input terminal of each inverter is connected to the output terminal of edge detection circuit 2 and the output terminal is connected to one input terminal of the AND-gate. The other input terminal of the AND-gate, with the AND-gate that is connected to the first-stage flip-flop circuit $32_1$, is connected to the output terminal of state setting circuit 33, and the AND-gates that are connected to the second-stage to last-stage flip-flip circuits $32_2$–$32_{20}$ are connected to the output terminals of the previous-stage flip-flop circuit $32_1$–$32_{19}$.

A reference clock is also input to first-stage to last-stage flip-flop circuits $32_1$–$32_{20}$. They are constituted so that each time one reference clock is input, the held value will be output to the next-stage logic circuit $32_2$–$32_{20}$.

State setting circuit 33 is constituted so that it will always output either the value "1" or "0" to first-stage logic circuit $31_1$. Here assume that "1" is always output.

When a "1" detection pulse is output from edge detection circuit 2, this detection pulse is output to each logic circuit $31_1$–$31_{20}$. For the output values of logic circuits $31_1$–$31_{20}$, the value "1" or "0," analogous to either the value that corresponds to the state where the RF signal level has not changed (called the first value hereafter) or the value that corresponds to the state where level has changed (called the second value hereafter) is output to each flip-flop circuit $32_1$–$32_{20}$. Here let "1" be the first value and "0" the second value.

The detection value is inverted to "0" by the inverters of logic circuit $31_1$–$31_{20}$, it is input to one input terminal of the AND-gates, and the output of the AND-gates will be "0." The output terminal of each AND-gate is connected to the input terminal of the respective first-stage to last-stage flip-flop circuits $32_1$–$32_{20}$. The "0" output from the AND-gates is input to each flip-flop circuit $32_1$–$32_{20}$, so that when a detection pulse is output, the stored contents of all the flip-flop circuits $32_1$–$32_{20}$ are reset to the second value "0."

Assuming that the first reference clock pulse is output when a "1" detection pulse is output, the detection pulse output will be "0" when the second reference clock pulse is output. A "0" detection pulse is inverted to "1" by each inverter of each logic circuit $31_1$–$31_{20}$ and is output to one input terminal of each AND-gate.

In this case, the output value of state setting circuit 33 and the detection pulse are input to first-stage logic circuit $31_1$. The logical sum "1" of the output value "1" of the state setting circuit and the output value "1" of the inverter is taken by the AND-gate in first-stage logic circuit $31_1$ and is output to first-stage flip-flop circuit $32_1$. Thus, the first value "1" is written to first-stage flip-flop circuit $32_1$.

In this case, with second-stage or subsequent logic circuits $31_2$–$31_{20}$, the logical sum of the signal "1" where the detection pulse has been inverted and each held value in the respective previous-stage flip-flop circuits $32_1$–$32_{19}$ is taken and "0" (second value) is output and written to the second-stage and subsequent flip-flop circuits $32_2$–$32_{20}$ from the AND-gates.

In this way, all "0s" (second value) are written to each flip-flop $32_1$–$32_{20}$ by the first reference clock pulse synchronous with the detection pulse and "1" (first value) is written to first-stage flip-flop circuit $32_1$ by the second reference clock pulse.

Flip-flop circuits $32_1$–$32_{20}$ output held values to the next-stage logic circuits $31_2$–$31_{20}$ each time one reference clock pulse is input, as described above. Thus, when the third clock pulse is output, "1" is output to third-stage logic circuit $31_3$ from second-stage flip-flop circuit $32_2$, the output value of third-stage logic circuit $31_3$ will become "1," and "1" is written to third-stage flip-flop circuit $32_3$. Each time that one reference clock pulse is output, flip-flop circuits $32_1$–$32_{20}$ will be filled with first value "1" one at a time from the first level to the last level in the manner described above. Letting n (where n is a natural number) be the number of reference clock pulses output after a detection pulse is output, circuits up to flip-flop circuit $32_{n-1}$ at the (n−1) stage will be filled with first value "1."

As stated above, the "1" (first value) with which flip-flops circuits $32_1$–$32_{20}$ are filled indicate the state in which the RF signal level has not changed, and the number in which "1" is written to each flip-flop circuit $32_1$–$32_{20}$ indicates the number of reference clock pulses output during which the RF signal level has not changed.

Afterward, when the RF signal level changes and a new detection pulse is output, the values held in each flip-flop circuit $32_1$–$32_{20}$ are all reset to "0" as stated above, but just before they are reset, the number of "1s" which has been written into flip-flops $32_1$–$32_{20}$ corresponds to the number of reference clock pulses (hereafter called edge spacing) output during the period of two successive detection pulses. The period of two successive detection pulses is analogous to one pulse width of an RF signal; thus, the number of reference clock pulses output with one RF signal reference pulse can be found from the edge spacing.

Maximum spacing detection circuit 4 is connected to the output of aforementioned edge spacing detection circuit 3.

This maximum spacing detection circuit 4 has multiple logic circuits $41_7$–$41_{20}$ and flip-flop circuits $42_7$–$42_{20}$.

Logic circuits $41_7$–$41_{20}$ each have an OR-gate and an AND-gate. One of the input terminals of the OR-gate is connected to the output terminal of the seventh-stage to last-stage flip-flop circuits $32_7$–$32_{20}$ of edge spacing detection circuit 3. The other input terminal is connected to the output terminal of first-stage to last-stage flip-flop circuits $42_7$–$42_{20}$ in maximum spacing detection circuit 4. The output of the OR-gate is connected to on input terminal of the AND-gate, and the other input terminal of the AND-gate is connected to the output terminal of maximum spacing reset circuit 71.

Each logic circuit $41_7$–$41_{20}$ is correlated one-to-one with seventh-stage to last-stage flip-flop circuits $32_7$–$32_{20}$ of edge spacing detection circuit 3 and first-stage to last-stage flip-flop circuits $42_7$–$42_{20}$ in maximum spacing detection circuit 4, respectively. They are constituted sequentially to compare the values held by seventh-stage to last-stage flip-flop circuits $32_7$–$32_{20}$ in edge spacing detection circuit 3 and the values held by first-stage to last-stage flip-flop circuits $42_7$–$42_{20}$ in maximum spacing detection circuit 4 and to output and write the larger value to first-stage to last-stage flip-flop circuits $42_7$–$42_{20}$ in maximum spacing detection circuit 4. Also first-stage to last-stage flip-flop circuits $42_7$–$42_{20}$ constituted one example of a maximum value memory circuit.

In the initial state, the values held by first-stage to last-stage flip-flop circuits $42_7$–$42_{20}$ in maximum spacing detection circuit 4 will all be "0" and when part or all of seventh-stage to last-stage flip-flop circuits $32_7$–$32_{20}$ in edge spacing detection circuit 3 are filled with "1," the value held by first-stage to last-stage flip-flop circuits $42_7$–$42_{20}$ in maximum spacing detection circuit 4 that correspond to flip-flip circuits $32_7$–$32_{20}$ that have been filled with "1" will be replaced with "1" and filled with "1."

Just before a detection pulse is output from edge detection circuit 2 and flip-flop circuits $32_1$–$32_{20}$ in edge spacing detection circuit 3 are reset, the number of circuits corresponding to the edge spacing is filled with "1." Thus, the number of flip-flop circuits $42_7$–$42_{20}$ in maximum spacing detection circuit 4 corresponding to the edge spacing will be filled with first value "1."

When a detection pulse is output and the values held by flip-flop circuits $32_1$–$32_{20}$ in edge spacing detection circuit 3 are all reset to "0," each flip-flop circuit $42_7$–$42_{20}$ in maximum spacing detection circuit 4 compares its own held value with the value held by seventh-stage to last-stage flip-flop circuits $32_7$–$32_{20}$ in edge spacing detection circuit 3 and holds the larger value. Thus, after reset, the state immediately before reset is maintained, and the number filled with "1" does not change from before reset.

After a detection pulse is output, with edge spacing detection circuit 3, each time one reference clock pulse is output, flip-flop circuits $32_1$–$32_{20}$ are sequentially filled from first stage to last stage. Afterward, just before a new detection pulse is output and they are reset, "1" will fill flip-flop circuits $32_1$–$32_{20}$ in edge spacing detection circuit 3 in a number that corresponds to the new edge spacing.

In this way, when a detection pulse is output, flip-flop circuits $32_1$–$32_{20}$ in edge spacing detection circuit 3 are filled with first value "1" up to the position corresponding to the edge spacing, and the edge spacing will be detected.

During this period, each flip-flop circuit $42_7$–$42_{20}$ in maximum spacing detection circuit 4 operates so that it will compare its own value with the value held by seventh-stage to last-stage flip-flop circuits $32_7$–$32_{20}$ in edge spacing detection circuit 3, respectively, and hold the larger value.

When a detection pulse is output a second time and edge spacing is detected a second time by edge spacing detection circuit 3, first value "1" will fill seventh-stage to last-stage flip-flop circuits $32_7$–$32_{20}$ in edge spacing detection circuit 3 in a number that corresponds to the edge spacing detected the second time. On the other hand, the first value "1" is held in each flip-flop circuit $42_7$–$42_{20}$ in maximum spacing detection circuit 4 in a number corresponding to the edge spacing detected the first time.

When the edge spacing detected the second time is smaller than the edge spacing detected the first time, the location in flip-flop circuits $32_7$–$32_{20}$ in edge spacing detection circuit 3 filled with "1" is ahead of the location filled by "1" in flip-flop circuits $42_7$–$42_{20}$ in maximum spacing detection circuit 4. The number in which "1" is written will be larger for flip-flop circuits $42_7$–$42_{20}$ in maximum spacing detection circuit 4 than for seventh-stage to last-stage flip-flop circuits $32_7$–$32_{20}$ in edge spacing detection circuit 3.

When each flip-flop circuit $42_7$–$42_{20}$ in maximum spacing detection circuit 4 holds "1," "1" will still be held even if "0" is output from edge spacing detection circuit 3. Thus, even if the number in which "1" has been written increases, it will not decrease. Thus, the stored contents of the maximum value memory circuit composed of each flip-flop circuit $42_7$–$42_{20}$ in the maximum spacing detection circuit will not change.

For example, when the stored contents of the temporary memory circuit composed of each flip-flop circuit $42_7$–$42_{20}$ in maximum spacing detection circuit 4 is "11111100000000" (edge spacing detected the first time is 13) and the stored contents of the maximum value memory circuit composed of seventh-stage to last-stage flip-flop circuits $32_7$–$32_{20}$ in edge spacing detection circuit 3 is "11100000000000" (edge spacing detected the second time is 10), the contents of the maximum value memory circuit will remain "11111100000000" (edge spacing 13 detected the first time).

In the opposite case, when the edge spacing detected the second time is larger than the edge spacing detected initially, the number where first value "1" is written will be smaller for flip-flop circuits $42_7$–$42_{20}$ in maximum spacing detection circuit 4 than for seventh-stage to last-stage flip-flop circuits $32_7$–$32_{20}$ in edge spacing detection circuit 3.

With each flip-flop circuit $42_7$–$42_{20}$ in maximum spacing detection circuit 4, the number of "1s" that have been written increases rather than decreases. Thus, in this case, maximum spacing detection circuit 4 will replace its own value with the value held by edge spacing detection circuit 3.

For example, when the stored contents of the maximum value memory circuit composed of each flip-flop circuit $42_7$–$42_{20}$ in maximum spacing detection circuit 4 is "11100000000000" (edge spacing detected the first time is 10) and the stored contents of the temporary memory circuit composed of seventh-stage to last-stage flip-flop circuits $32_7$–$32_{20}$ in edge spacing detection circuit 3 is "11111100000000" (edge spacing detected the second time is 13), the stored contents of the maximum value memory circuit will be replaced by the contents of the temporary memory circuit "11111100000000" (edge spacing 13 detected the second time).

In this way, the larger edge spacing from the edge spacing detected the second time will be stored in the maximum value memory circuit constituted with flip-flop circuits $42_7$–$42_{20}$ and the number corresponding to that edge spacing will be filled with first value "1."

Each time detection pulses are output multiple times, the edge spacing held in edge spacing detection circuit 3 is compared with the edge spacing detected the previous time and up to the position corresponding to the larger of the edge spacings will be filled with "1." Thus, flip-flop circuits $42_7$–$42_{20}$ in maximum spacing detection circuit 4 will be filled with first value "1" up to the position that corresponds to the maximum value of edge spacing sampled multiple times.

Timing generation circuit 7 has maximum spacing reset circuit 71 and minimum spacing reset circuit 72. Of these, maximum spacing reset circuit 71 is connected to logic circuits $41_7$–$41_{20}$ of maximum spacing detection circuit 4 and is constituted so that it can output a maximum reset signal at prescribed time intervals.

The value held by each flip-flop circuit $42_7$–$42_{20}$ in maximum spacing detection circuit 4 is not reset until a maximum reset signal is output from maximum spacing reset circuit 71. This maximum reset signal is a signal that is "0" on reset and "1" otherwise. "0" is output at each prescribed interval that is longer than the period of one frame and resets maximum spacing detection circuit 4.

Just before a maximum reset signal is output, the maximum value of edge spacing detected multiple times will be held for the period during which two successive maximum reset signals are output. A 1-frame period is contained in this period, as stated above, so flip-flop circuits $42_7$–$42_{20}$ in maximum spacing detection circuit 4 will be filled with first value "1" up to the position that corresponds to the maximum value (hereafter called maximum edge spacing) from the edge spacings in one frame.

The relationship of the RF signal, reference clock, detection pulse, edge spacing, maximum edge spacing, and maximum reset signal is shown in the timing diagram FIG. 3. As shown in FIG. 3, during the period until a maximum reset signal is output, each time a detection pulse is output, edge spacing takes the value 4, 6, 7, 9, 5, 6, 4, 14, 4, 7, the maximum edge spacing during that period will be 4, 6, 7, 9, 14, and it will finally take the value 14.

As explained above, each time an RF signal edge is detected, flip-flop $32_1$–$32_{20}$ in edge spacing detection circuit 3 is filled with "1" (first value) up to the position corresponding to the edge spacing, and flip-flop circuits $42_7$–$42_{20}$ in maximum spacing detection circuit 4 will be filled with "1" (first value) up to the position corresponding to the maximum edge spacing in one frame, and in this way the maximum edge spacing for one frame can be found.

When the maximum edge spacing is found in this way, and it is compared with the correct maximum spacing, that is, the number that represents the frame synchronizing signal period, it can be determined whether the RF signal read frequency or reference clock frequency that is currently being output is higher. In the case of DVDs, the correct maximum edge spacing is 14; thus, if the maximum edge spacing detected by maximum spacing detection circuit 4 is 15, it is clear that the reference clock frequency is 1 clock higher than the RF signal read frequency. Conversely, if the maximum edge spacing detected by maximum spacing detection circuit 4 is 13, it is clear that the reference clock frequency is 1 clock lower than the RF signal read frequency.

By making the reference clock frequency higher or lower based on the results of this comparison, the maximum edge spacing detected by maximum spacing detection circuit 4 can be matched with a number (14 with DVDs) that indicates the frame synchronizing signal period and the RE signal read frequency and the reference clock frequency can be matched.

In this connection, there are cases when a foreign substance may adhere to the read surface of a disk, e.g., a DVD, and the non-signal state caused by this foreign substance may occur for a long period of time. When this non-signal state continues for a longer period than the maximum edge spacing, a malfunction occurs in that the period of the non-signal state is considered to be the maximum edge spacing and the RF signal read frequency and the reference clock frequency are considered to have been matched, regardless of whether they are matched.

With frequency comparison circuit 1 of this embodiment, minimum spacing detection circuit 5 is furnished for the output of aforementioned maximum spacing detection circuit 4 to eliminate adverse effects produced by this non-signal state.

Minimum spacing detection circuit 5 has the same number of logic circuits $51_7$–$51_{20}$ and flip-flop circuits $52_7$–$52_{20}$ as logic circuits $41_7$–$41_{20}$ and flip-flop circuits $42_7$–$42_{20}$ in maximum spacing detection circuit 4.

Each logic circuit $51_7$–$51_{20}$ has an AND-gate and an OR-gate. One input terminal of the AND-gate in logic circuits $51_7$–$51_{20}$ in minimum spacing detection circuit 5 is connected to the output terminal of first-stage to last-stage flip-flop circuits $42_7$–$42_{20}$ in maximum spacing detection circuit 4, and the other input terminal is connected to the output terminal of first-stage to last-stage flip-flop circuits $52_7$–$52_{20}$ in minimum spacing detection circuit 5.

Each logic circuit $51_7$–$51_{20}$ is correlated one-to-one with first-stage to last-stage flip-flop circuits $42_7$–$42_{20}$ in maximum spacing detection circuit 4 and first-stage to last-stage flip-flop circuits $52_7$–$52_{20}$ in minimum spacing detection circuit 5. They are constituted to compare the values held by first-stage to last-stage flip-flop circuits $42_7$–$42_{20}$ in maximum spacing detection circuit 4 and the values held by first-stage to last-stage flip-flop circuits $52_7$–$52_{20}$ in minimum spacing detection circuit 5 and to write the smaller value to first-stage to last-stage flip-flop circuits $52_7$–$52_{20}$ in minimum spacing detection circuit 5. First-stage to last-stage flip-flop circuits $52_7$–$52_{20}$ in minimum spacing detection circuit 5 also constituted one example of a minimum value memory circuit.

Aforementioned first-stage to last-stage flip-flop circuits $42_7$–$42_{20}$ in maximum spacing detection circuit 4 output the values held by each flip-flop circuit $42_7$–$42_{20}$ to logic circuits $51_7$–$51_{20}$, respectively, of minimum spacing detection circuit 5 at one time just before a maximum reset signal is output and each of their own held values is reset.

In the initial state, the values held by each flip-flop circuit $52_7$–$52_{20}$ in minimum spacing detection circuit 5 are all "1." Just before a maximum reset signal is output, flip-flop circuits $42_7$–$42_{20}$ in maximum spacing detection circuit 4 are filled with "1" up to a location corresponding to the maximum edge spacing. When the held value corresponding to the maximum edge spacing is output to minimum spacing detection circuit 5, the value held by each flip-flop circuit $52_7$–$52_{20}$ in minimum spacing detection circuit 5 is compared with the value held by the respective flip-flop circuit $42_7$–$42_{20}$ in maximum spacing detection circuit 4, it is replaced with the smaller value, and "1s" are loaded up to the position corresponding to maximum edge spacing.

Immediately after a maximum reset signal is output, the values held by first-stage to last-stage flip-flop circuits $42_7$–$42_{20}$ in maximum spacing detection circuit 4 are all reset to "0," but the values held after reset are not output to minimum spacing detection circuit 5. Thus, flip-flop circuits $52_7$–$52_{20}$ in minimum spacing detection circuit 5 maintain the state prior to reset and keep the state where up to the position corresponding to the maximum edge spacing is filled with "1."

Just before the subsequent reset operation, the values held from first-stage to last-stage flip-flop circuits $42_7$–$42_{20}$ in maximum spacing detection circuit 4 are output to logic circuits $51_7$–$51_{20}$ in minimum spacing detection circuit 5 at one time.

Just before a maximum reset signal is output, a value corresponding to the maximum edge spacing detected that time is stored in the maximum value memory circuit composed of first-stage to last-stage flip-flop circuits $42_7$–$42_{20}$ in maximum spacing detection circuit 4. A value corresponding to the maximum edge spacing detected the previous time is stored in the minimum value memory circuit composed of first-stage to last-stage flip-flop circuits $52_7$–$52_{20}$ in minimum spacing detection circuit 5. When a maximum reset signal is output the second time and the maximum edge spacing is found the second time, the maximum edge spacing detected the second time will be held in the maximum value memory circuit and the edge spacing detected the first time will be held in the minimum value memory circuit.

In this case, the value held by each flip-flop circuit $52_7$–$52_{20}$ in minimum spacing detection circuit 5 just before a maximum reset signal is output the second time will vary according to the magnitude of the maximum edge spacing detected initially and the maximum edge spacing detected the second time.

When the maximum edge spacing detected the second time is larger than the maximum edge spacing detected initially, the position filled with "1" in flip-flop circuits $42_7$–$42_{20}$ in maximum spacing detection circuit 4 is behind the position filled with "1" in flip-flop circuits $52_7$–$52_{20}$ in minimum spacing detection circuit 5 and the number of "1s" written is larger for flip-flop circuits $42_7$–$42_{20}$ in maximum spacing detection circuit 4 than for flip-flop circuits $52_7$–$52_{20}$ in minimum spacing detection circuit 5.

When each flip-flop circuit $52_7$–$52_{20}$ in minimum spacing detection circuit 5 holds "0," "0" will still be held even if "1" is output from maximum spacing detection circuit 4. Although the number of "1s" written may decrease, it will not increase, and the stored contents of the minimum value memory circuit in minimum spacing detection circuit 5 in this case will not change.

For example, when the stored content of the maximum value memory circuit composed of each flip-flop circuit $42_7$–$42_{20}$ in maximum spacing detection circuit 4 is "1111110000000" (maximum edge spacing detected the second time is 13) and the stored content of the minimum value memory circuit composed of each flip-flop circuit $52_7$–$52_{20}$ in minimum spacing detection circuit 5 is "1110000000000" (maximum edge spacing detected the first time is 10), the stored content of the minimum value memory circuit remains "1110000000000" (maximum edge spacing 10 detected the first time).

In the opposite case, when the maximum edge spacing detected the second time is smaller than the maximum edge spacing detected initially, the position filled by "1" in flip-flop circuits $52_7$–$52_{20}$ in minimum spacing detection circuit 5 is ahead of the position filled with "1s" in flip-flop circuits $42_7$–$42_{20}$ in maximum spacing detection circuit 4, and the number in which "1" is written will be smaller for flip-flop circuits $42_7$–$42_{20}$ in maximum spacing detection circuit 4 than for flip-flop circuits $52_7$–$52_{20}$ in minimum spacing detection circuit 5.

In this case, although the number of "1s" which have been written in each flip-flop circuit $52_7$–$52_{20}$ in minimum spacing detection circuit 5 may decrease, it will not increase. Thus, the minimum value memory circuit in minimum spacing detection circuit 5 replaces the stored contents with the stored contents of the maximum value memory circuit.

For example, when the stored content of the maximum value memory circuit composed of each flip-flop circuit $42_7$–$42_{20}$ in maximum spacing detection circuit 4 is "1110000000000" (maximum edge spacing detected the second time is 10) and the stored content of the minimum value memory circuit composed of each flip-flop circuit $52_7$–$52_{20}$ in minimum spacing detection circuit 5 is "1111110000000" (maximum edge spacing detected the first time is 13), the stored contents of the minimum value memory circuit are replaced by the stored contents of the maximum value memory circuit "1110000000000" (maximum edge spacing 10 detected the second time).

In this way, the smaller value of the maximum edge spacing detected the second time is held in flip-flop circuits $52_7$–$52_{20}$ in minimum spacing detection circuit 5 and up to a position corresponding to the maximum edge spacing held will be filled by "1."

Each time a maximum reset signal is output multiple times, the magnitudes of the maximum edge spacings are compared and the smaller value is held. Thus, up to a position that corresponds to the minimum value of the maximum edge spacing sampled multiple times will be filled by "1" in flip-flop circuits $52_7$–$52_{20}$ in minimum spacing detection circuit 5.

Minimum spacing reset circuit 72 in timing generation circuit 7 is connected to logic circuits $51_7$–$51_{20}$ in minimum spacing detection circuit 5, and is constituted to be able to output a minimum reset signal.

The value held by each flip-flop $52_7$–$52_{20}$ in minimum spacing detection circuit 5 is not reset until this minimum reset signal is output. This minimum reset signal is a pulse that will be "1" with reset and "0" otherwise. At the very least, "1" is output for each time interval that includes multiple maximum reset signals and the values held by each flip-flop circuit $52_7$–$52_{20}$ in minimum spacing detection circuit 5 will be reset to the value "1111111111111."

Just before this minimum reset signal is output, a value that corresponds to the minimum value of the maximum edge spacing sampled multiple times will be held in each flip-flop circuit $52_7$–$52_{20}$ in minimum spacing detection circuit 5.

An example of the relationship of the maximum reset signal, edge spacing, maximum edge spacing, maximum edge spacing minimum value, final minimum value, and minimum reset signal is shown in the timing diagram in FIG. 4. In FIG. 4, the maximum edge spacing minimum value represents the minimum value of the maximum edge spacing that changes each time a maximum reset signal is output. The final minimum value represents the minimum value of the maximum value just before the minimum reset signal is output.

In FIG. 4, each time a maximum reset signal is output, the maximum edge spacing will be 15, 14, 15, 14, 16, 15, 14, 14, 16, 14, 14, 15, 16, and 14, and each time the maximum reset signal is output, the maximum edge spacing minimum value takes on a value that is 14, 15, 14, 16, 15, 14, 16, 14, 16. With the maximum edge spacing minimum value, the fact that a value of 14 is taken in each case just before the minimum reset signal is output is indicated.

Thus, up to the position corresponding to the maximum edge spacing minimum value detected multiple times will be filled with "1s" in flip-flop circuits $52_7$–$52_{20}$ in minimum spacing detection circuit 5.

When minimum spacing detection circuit 5 is finished and maximum edge spacings are detected multiple times to find their minimum value in this way, even if the period of a non-signal state is detected as maximum edge spacing, if the period of the non-signal state is longer than the original maximum edge spacing, the period of the non-signal state will not be considered a true maximum edge spacing. Thus, it is possible to be sure that a malfunction will not occur due to the period of a non-signal state being considered the maximum edge spacing.

Held values that correspond to the minimum value of maximum edge spacing detected multiple times are output to frequency difference extraction circuit 8 from each flip-flop circuit $52_7$–$52_{20}$ in minimum spacing detection circuit 5.

Frequency difference extraction circuit 8 has first through fourteenth output logic circuits $81_1$–$81_{14}$ composed of a combination of AND-gates and inverters, and the like.

Of each output logic circuit $81_1$–$81_{14}$, first output logic circuit $81_1$ is constituted with an inverter. Second through fourteenth output logic circuits $81_2$–$81_{14}$ are constituted with AND-gates. They are constituted to output "1" only when the stored contents of each adjacent flip-flop circuit $52_7$–$52_{20}$ in minimum spacing detection circuit 5 are different and to output "0" in the case of the same stored contents. For example, second, third . . . output logic circuits $81_2$, $81_3$ . . . are constituted to output "1" when the stored contents of first-stage, second-stage . . . flip-flop circuits $52_7$, $52_8$ . . . and the stored contents of second-stage, third-stage . . . flip circuits $52_8$, $52_9$ . . . are different.

Thus, by detecting from which output logic circuits $81_1$–$81_{14}$ "1" is output, it is possible to detect up to which position of flip-flop circuits $52_7$–$52_{20}$ in minimum spacing detection circuit 5 is filled with "1."

For example, when the stored contents of the minimum value memory circuit composed of flip-flop circuits $52_7$–$52_{20}$ in minimum spacing detection circuit 5 is "10000000000000"
"11000000000000"
"11100000000000"
etc., the values held by the first-stage, second-stage and third-stage flip-flop circuits $52_7$, $52_8$, $52_9$, . . . and the values held by the next-stage flip-flop circuits $52_8$, $52_9$, $52_{10}$, . . . are "1" and "0," respectively, so the output of second, third, fourth, . . . output logic circuits $81_2$, $81_3$, $81_4$, . . . will each be "1." In this case, up to the first-stage, second-stage, and third-stage flip-flop circuits $52_7$, $52_8$, $52_9$, . . . are filled with "1."

As described above, the number of locations with a "1" corresponds to the minimum value of the maximum edge spacing; thus, it is possible to find the minimum value of the maximum edge spacing from those output logic circuits $81^1$–$81^4$ from which a "1" is output, and the error between the RF signal read frequency and the reference clock frequency can be found.

In a DVD, the maximum edge spacing will be such that when the number of reference clock pulses is 14, the RF signal read frequency and the reference clock frequency will agree. In this state, the number of flip-flop circuits $52_7$–$52_{20}$ in minimum spacing detection circuit 5 in which a "1" is written is seven, and in a state where the value held by seventh-stage and eighth-stage flip-flop circuits $52_{13}$ and $52_{14}$ is "1" and "0," respectively, only the output of eighth output logic circuit 818 will be "1." Thus, it can be seen that the RF signal read frequency and the reference clock frequency agree in a case where only the output of eighth output logic circuit $81_8$ is "1."

Also, when "1" is output from ninth output logic circuit $81_9$, the maximum edge spacing minimum value is 15; thus, the reference clock frequency will be higher than the RF signal frequency by 1 clock pulse. Let the error in this case be +1. In the same way, error when "1" is output from tenth through fourteenth output logic circuits $81_{10}$–$81_{14}$ will be +2 to +6, respectively. For example, when "1" is output from fourteenth output logic circuit $81_{14}$, it can be seen that the reference clock frequency will be higher than the RF signal frequency by 6 pulses.

In addition, when "1" is output from seventh output logic circuit $81_7$, the maximum edge spacing minimum value is 13; thus, the reference clock frequency will be lower than the RF signal frequency by 1 clock pulse. Let the error in this case be −1. In the same way, error when "1" is output from first through sixth output logic circuits $81_1$–$81_6$ will be −7 to −2, respectively. For example, when "1" is output from sixth output logic circuit $81_6$, it can be seen that the reference clock frequency is lower than the RF signal frequency by 2 clock pulses.

In this way, depending on which of the output logic circuits "1" is output from among first through fourteenth output logic circuits $81_1$–$81_{14}$, the error between the reference clock frequency and the RF signal read frequency can be detected.

The output signal of each output logic circuit $81_1$–$81_{14}$ is output to output circuit 9. This output circuit 9 outputs a control voltage in response to the output signals of output logic circuits $81_1$–$81_{14}$ to VCO 14 via aforementioned loop filter 13 in the PLL loop in FIG. 2. VCO 14 increases or decreases the reference clock frequency in response to this control voltage.

For example, when a "1" is output from seventh output logic circuit $81_7$, the error is −1 and the reference clock frequency is lower than the RF signal frequency by 1 clock pulse. Thus, the control voltage of VCO 14 is controlled to raise the reference clock frequency 1 clock pulse and VCO 14 raises the reference clock frequency 1 clock pulse.

In this way, the control voltage of a magnitude corresponding to the error is increased or decreased to adjust the reference clock frequency, and by making the error between the RF signal read frequency and the reference clock frequency 0, RF signal read frequency and reference clock frequency will agree. After the RF signal read frequency and the reference clock frequency agree and only the output of eighth output logic circuit $81_8$ is "1," the output circuits control the control voltage of VCO 14 so that the reference clock frequency currently being output will be maintained.

With the operation above, after the reference clock frequency agrees with the RF signal read frequency, the reference clock is compared with the RF signal phase by a phase comparator, not shown, the phase is matched to the RF signal phase, and the correct reference clock is generated. RF signals are read synchronously with the correct reference clock produced in this way.

As explained above, the frequency comparison circuit of this embodiment is formed from flip-flop circuits and logic circuits, and no comparators or binary counters are used. Thus, the operating speed can be increased relative to existing circuits that use slow-speed comparators and binary counters, and higher-speed data reading can be handled.

Additionally, the prior art only detects when the reference clock frequency is higher or lower than the RF signal read frequency, and in either case, the reference clock frequency would have been increased or decreased by a constant frequency. In this embodiment, however, the error between the reference clock frequency that is currently being output and the RF signal read frequency is detected and the reference clock frequency can be increased or decreased according to this error. Thus, when the error is large, the amount by which the reference clock frequency is increased or decreased can be made larger. On the other hand, by making the amount of increase or decrease smaller when the error is small, it can be matched with the RF signal read frequency in a short time, compared to the prior art.

Note that aforementioned frequency comparison circuit 1 was explained for reading RF signals on a DVD, but the present invention is not limited in this way and can also be applied to reading RF signals on a CD, for example. In the case of a CD, RF signals are data that have a maximum 11T pulse width; thus, it could be the case that when the maximum edge spacing minimum value reaches 11, the RF signal and reference clock frequencies would agree.

When the maximum edge spacing minimum value is 11, up to fourth-stage flip-flop circuit $52_{10}$ in minimum spacing detection circuit 5 is filled with "1" in flip-flop circuits $52_7$–$52_{20}$ in minimum spacing detection circuit 5 and "1" is output from fifth output logic circuit $81_5$. Thus, in the case of a CD, it could just be set up so that when "1" is output from fifth output logic circuit $81_5$, the error between the RF signal frequency and the reference clock frequency will be 0, and it can easily be applied to reading RF signals on a CD without even changing the circuit configuration.

Figure 5:
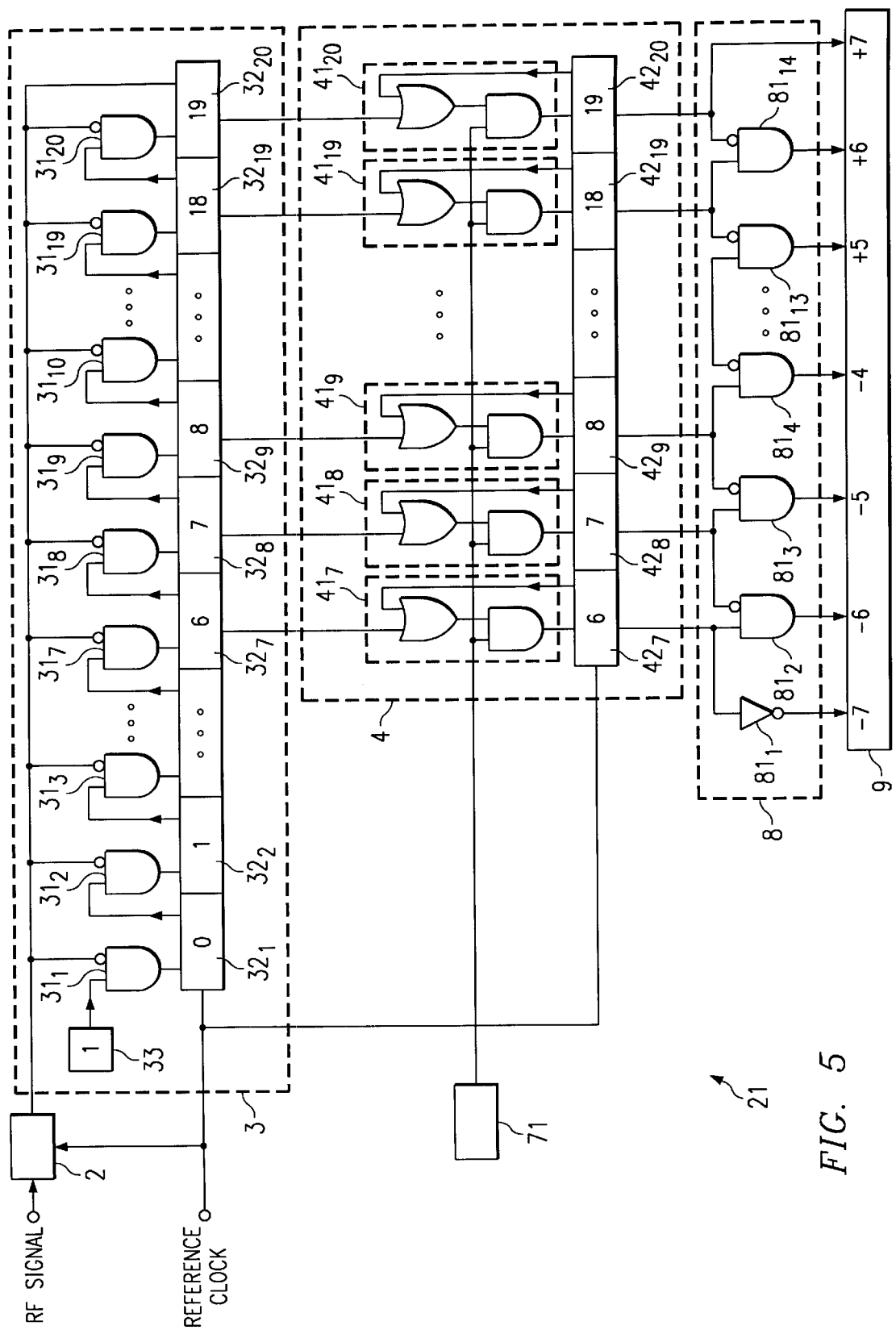
FIG. 5: Circuit diagram that explains a frequency comparison circuit of another embodiment of the present invention.

Also, in aforementioned frequency comparison circuit 1, the minimum value of maximum edge spacing sampled multiple times is found with minimum spacing detection circuit 5 and malfunctioning due to non-signal states produced by the adherence of foreign substances to the disk and considered to be maximum spacing can be prevented. But if the adherence of foreign substances or the like is not taken into consideration, as shown in FIG. 5, the present invention could also be designed to output the output of maximum spacing detection circuit 4 to frequency difference extraction circuit 8 directly without furnishing minimum spacing detection circuit 5. In this case, minimum spacing detection circuit 5 is not required, so that the time required for matching frequencies can be further reduced.

Figure 6:
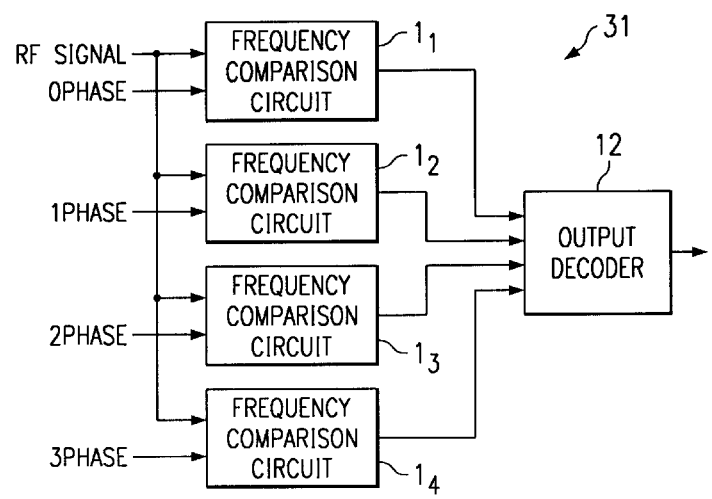
FIG. 6: Figure that explains the configuration of a frequency comparator of that other embodiment of the present invention.
Figure 7:
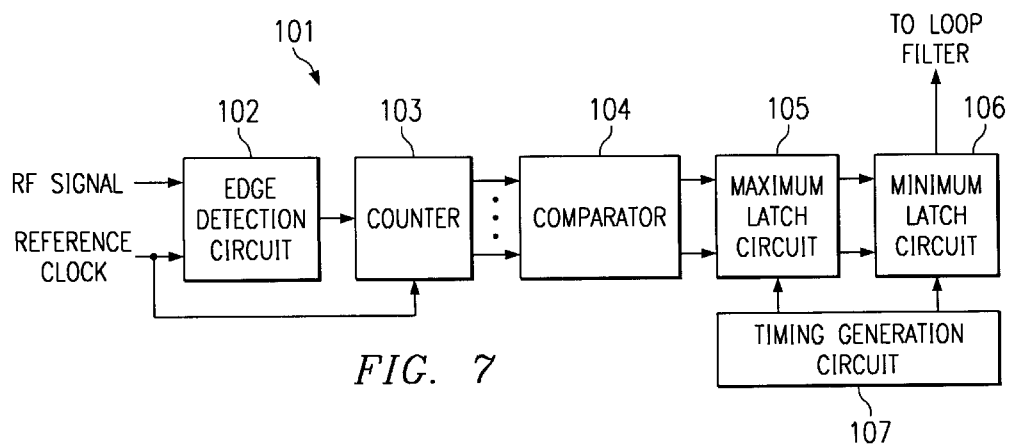
FIG. 7: Circuit diagram that explains the constitution of an existing frequency comparison circuit.

In addition, multiple aforementioned frequency comparison circuits 1 could also be furnished. One example of frequency comparator 21, where four frequency comparison circuits $1_1$–$1_4$ are furnished with the constitution explained in FIG. 1, is shown in FIG. 6.

Each frequency comparison circuit $1_1$–$1_4$ is constituted to operate in response to a 0-phase to 3-phase reference clock, respectively. The output of each 0-phase to 3-phase reference clocks has a phase shift of 1/4 T. The output signal of each frequency comparison circuit $1_1$–$1_4$ is also output to output decoder 12 and averaged by output decoder 12 to give a reference clock. In this way, when four frequency comparison circuits $1_1$–$1_4$ are furnished, RF signal rising/falling edge is detected by comparison with a 4-phase reference clock, so that detection precision will be 4-fold and frequency comparison resolution will be 4-fold. Note that with FIG. 5, four frequency comparison circuits $1_1$–$1_4$ have been furnished, but the number of frequency comparison circuits is not limited in this way. Any number of frequency comparison circuits could be furnished according to the frequency comparison resolution required. Frequency comparison resolution can be increased just by increasing the number of frequency comparison circuits (1).

High-speed data reading will be possible.

What is claimed is:

1. Frequency comparison circuit comprising:
    an edge detection circuit into which serial signals and clock signals, which are binary data, are input, and that detects pulse signals that indicate changes in the serial signal data,
    an edge spacing detection circuit into which the pulse signals and the clock signals are input and that outputs numerical data that indicate the number of cycles of the clock signals corresponding to periods in which the serial signal data do not change,
    and a maximum value memory circuit into which the numerical data, the clock signals, and a first reset signal are input, and that stores and outputs the maximum value of the numerical data in response to the clock signals and also resets the stored maximum value in response to the first reset signal.

2. Frequency comparison circuit described in claim 1 further comprising a minimum value memory circuit into which the maximum value, the first reset signal, and a second reset signal are input and that stores and outputs the minimum value of the maximum value in response to the first reset signal and that also resets the minimum value in response to the second reset signal.

3. A frequency comparison circuit described in claim 1 wherein the edge spacing detection circuit includes a series transistor, the numerical value data are found by sequentially shifting a first value or a second value from the initial level of the series transistor in response to the clock signals when the pulse signal is a first value or a second value, and the series transistor is reset by a logic change in the pulse signal.

4. Frequency comparison circuit described in claim 3, wherein the maximum spacing detection circuit includes multiple first unit memory circuits that correspond to the prescribed level of the series transistor, and each of the first unit memory circuits finds the maximum value by calculating the logical sum of prescribed bits in the numerical data and a stored value.

5. Frequency comparison circuit described in claim 4, wherein the minimum value detection circuit includes multiple second unit memory circuits that correspond to the first unit memory circuits and each of the second unit memory circuits finds the minimum value by calculating the logical sum of prescribed bits in the maximum value and a stored value.

6. Frequency comparison circuit described in claim 4 further comprising an output circuit that finds frequency comparison signals from the difference in values of adjacent first unit memory circuits or second unit memory circuits.

7. A frequency comparison circuit described in claim 2 wherein the edge spacing detection circuit includes a series transistor, the numerical value data are found by sequentially shifting a first value or a second value from the initial level of the series transistor in response to the clock signals when the pulse signal is a first value or a second value, and the series transistor is reset by a logic change in the pulse signal.

8. Frequency comparison circuit described in claim 7, wherein the maximum spacing detection circuit includes multiple first unit memory circuits that correspond to the prescribed level of the series transistor, and each of the first unit memory circuits finds the maximum value by calculating the logical sum of prescribed bits in the numerical data and a stored value.

9. Frequency comparison circuit described in claim 8, wherein the minimum value detection circuit includes multiple second unit memory circuits that correspond to the first unit memory circuits and each of the second unit memory circuits finds the minimum value by calculating the logical sum of prescribed bits in the maximum value and a stored value.

10. Frequency comparison circuit described in claim 5 further comprising an output circuit that finds frequency comparison signals from the difference in values of adjacent first unit memory circuits or second unit memory circuits.

* * * * *